United States Patent
Nonoyama et al.

(10) Patent No.: US 7,150,838 B2
(45) Date of Patent: Dec. 19, 2006

(54) PIEZOELECTRIC CERAMIC COMPOSITION, ITS PRODUCTION METHOD AND PIEZOELECTRIC DEVICE

(75) Inventors: Tatsuhiko Nonoyama, Chiryu (JP); Toshiatsu Nagaya, Kuwana (JP); Yasuyoshi Saito, Toyota (JP); Kazumasa Takatori, Nagoya (JP); Hisaaki Takao, Seto (JP); Takahiko Homma, Owariasahi (JP)

(73) Assignee: Denso Corporation, Kariya (JP)

( * ) Notice: Subject to any disclaimer, the term of this patent is extended or adjusted under 35 U.S.C. 154(b) by 159 days.

(21) Appl. No.: 10/391,192

(22) Filed: Mar. 19, 2003

(65) Prior Publication Data

US 2003/0178606 A1 Sep. 25, 2003

(30) Foreign Application Priority Data

| Mar. 20, 2002 | (JP) | 2002-077591 |
| Mar. 20, 2002 | (JP) | 2002-077592 |
| Feb. 3, 2003 | (JP) | 2003-026198 |
| Feb. 3, 2003 | (JP) | 2003-026199 |

(51) Int. Cl.
  $C04B\ 35/495$ (2006.01)
(52) U.S. Cl. ............. 252/62.9 R; 310/311; 501/134
(58) Field of Classification Search ............. 310/311; 501/134; 252/62.9 R
   See application file for complete search history.

(56) References Cited

U.S. PATENT DOCUMENTS

| 6,387,295 B1 | 5/2002 | Saito |
| 6,458,287 B1 | 10/2002 | Nishida et al. |
| 2003/0178606 A1 | 9/2003 | Nonoyama et al. |

FOREIGN PATENT DOCUMENTS

| EP | 1 032 057 A1 | 8/2000 |
| JP | 49-33907 | 3/1974 |
| JP | 49-56198 | 5/1974 |
| JP | 51-10398 | 1/1976 |
| JP | 55-55589 | 4/1980 |
| JP | 56-120180 | 9/1981 |
| JP | 59-88322 | * 5/1984 |
| JP | A-5-82387 | 4/1993 |
| JP | 7-82024 | 3/1995 |
| JP | 2000-313664 | 11/2000 |
| JP | 2001-151573 | 6/2001 |
| JP | 2001-316182 | 11/2001 |
| JP | 2001-342065 | 12/2001 |
| JP | 2002-068835 | 3/2002 |
| JP | 2003-055048 | 2/2003 |
| JP | 2003-342070 | 12/2003 |
| JP | 2003-342071 | 12/2003 |

OTHER PUBLICATIONS

Translation of JP 07-82024.*
Derwent abstract for SU 591435, Jan. 16, 1978.*

* cited by examiner

*Primary Examiner*—C. Melissa Koslow
(74) *Attorney, Agent, or Firm*—Nixon & Vanderhye P.C.

(57) ABSTRACT

This invention provides a piezoelectric ceramic composition that does not contain lead, can be sintered at a normal pressure and has a high electro-mechanical coupling coefficient and a small dielectric loss, its production method, and a piezoelectric device utilizing the piezoelectric ceramic composition. The invention relates to a piezoelectric composition containing a compound expressed by the general formula $\{Li_x(K_{1-y}Na_y)_{1-x}\}(Nb_{1-z}Ta_z)O_3$, each of x, y and z respectively falling within composition range of $0 \leq x \leq 0.2$, $0 \leq y \leq 1.0$ and $0 \leq z \leq 0.4$, as its main component, and further containing nickel or a nickel-containing compound. To provide a piezoelectric device that does not contain lead, can be sintered at a normal pressure and has a high electro-mechanical coupling coefficient Kp and a small dielectric loss, the piezoelectric ceramic composition of the invention is expressed by the general formula $\{Li_x(K_{1-y}Na_y)_{1-x}\}(Nb_{1-z-n}Ta_z(Mn_{0.5}W_{0.5})_n)O_3$, each of x, y, z and n respectively falling within a composition range of $0 \leq x \leq 0.2$, $0 \leq y \leq 1.0$, $0 \leq z \leq 0.4$ and $0 < n \leq 0.1$.

20 Claims, No Drawings

PIEZOELECTRIC CERAMIC COMPOSITION, ITS PRODUCTION METHOD AND PIEZOELECTRIC DEVICE

BACKGROUND OF THE INVENTION

1. Field of the Invention

This invention relates to a piezoelectric ceramic composition not containing lead in the composition, its production method, and a piezoelectric device using the piezoelectric ceramic composition as its material.

2. Description of the Related Art

A PZT ($PbTiO_3$–$PbZrO_3$) component system ceramic containing lead has been used in the past as a piezoelectric ceramic composition.

PZT described above is excellent in an electro-mechanical coupling coefficient and in piezoelectric characteristics such as a piezoelectric constant, and piezoelectric devices utilizing PZT have been widely used in sensors, actuators, filters, and so forth.

Though having excellent characteristics, the piezoelectric ceramic composition formed of PZT contains lead as one of its constituent elements. Therefore, detrimental lead is likely to elute from industrial wastes of products containing PZT and to induce environmental pollution. Concerns about the environment in recent years have made it difficult to produce those products that may result in the environmental pollution such as PZT. Therefore, development of piezoelectric ceramic compositions not containing lead has been required, and a piezoelectric ceramic composition expressed by the general formula $(K_{1-x}Na_x)NbO_3$ (with the proviso that $0<x<1$) has drawn increased attention ("*Journal of the American Ceramics Society*", 1962, Vol. 45, No. 5, p209).

However, because sintering of the piezoelectric ceramic composition expressed by the general formula $(K_{1-x}Na_x)NbO_3$ (with the proviso that $0<x<1$) described above is difficult, hot-press sintering must be conducted and the cost of production becomes high. The piezoelectric ceramic composition has a low mechanical quality coefficient Qm and a large dielectric loss. As the piezoelectric ceramic composition according to the prior art has a low piezoelectric $d_{31}$ constant and a low electro-mechanical coupling coefficient Kp, its application to piezoelectric devices such as piezoelectric filters, piezoelectric vibrators, piezoelectric transformers, piezoelectric ultrasonic motors, piezoelectric gyro sensors, knock sensors, etc, that require a high piezoelectric $d_{31}$ constant and a high electro-mechanical coupling coefficient Kp has been difficult.

Therefore, though the piezoelectric ceramic composition expressed by the general formula $(K_{1-x}Na_x)NbO_3$ (with the proviso that $0<x<1$) is believed to be a promising novel composition that will replace PZT, it has hardly been put into practical application. For this reason, a lead type piezoelectric ceramic composition, such as PZT, that may invite the environmental pollution, is still utilized widely at present even though the piezoelectric ceramic composition expressed by the general formula described above has been developed.

SUMMARY OF THE INVENTION

In view of the problems described above, this invention aims at providing a piezoelectric ceramic composition that does not contain lead, can be sintered at a normal pressure and has a high mechanical quality coefficient and a small dielectric loss, its production method, and a piezoelectric device utilizing the piezoelectric ceramic composition (Problem 1).

The invention further aims at providing a piezoelectric ceramic composition that does not contain lead, can be sintered at a normal pressure and has a high piezoelectric $d_{31}$ constant and a high mechanical quality coefficient Kp, its production method, and a piezoelectric device utilizing the piezoelectric ceramic composition (Problem 2).

(Re: Problem 1)

The following first to fifth aspects of the invention are solution means for solving the Problem 1.

A first aspect of the invention provides a piezoelectric ceramic composition containing a compound expressed by the general formula $\{Li_x(K_{1-y}Na_y)_{1-x}\}(Nb_{1-z}Ta_z)O_3$, each of x, y and z respectively falling within composition range of $0 \leq x \leq 0.2$, $0 \leq y \leq 1.0$ and $0 \leq z \leq 0.4$, as a main component, and further containing nickel or a nickel-containing compound.

The content form of nickel or the nickel-containing compound in the piezoelectric ceramic composition includes the form in which nickel replaces at least one kind of Li, K, Na, Nb and Ta in the compound expressed by the general formula $\{Li_x(K_{1-y}Na_y)_{1-x}\}(Nb_{1-z}Ta_z)O_3$, and the form in which nickel or the nickel-containing compound is contained in the form of the nickel compound.

Next, the function and effect of this invention will be explained.

The piezoelectric ceramic composition of the invention is expressed by the general formula $\{Li_x(K_{1-y}Na_y)_{1-x}\}(Nb_{1-z}Ta_z)O_3$, and does not contain lead in the composition.

Therefore, detrimental lead does not elute from wastes of the piezoelectric ceramic composition into the natural world, and this composition is safe.

In the general formula given above, each of x, y and z falls within the range described above. As will be obvious from the later-appearing Examples, the piezoelectric ceramic composition has a high mechanical quality coefficient Qm and a small dielectric loss. Therefore, the piezoelectric ceramic composition can be sufficiently compacted even by sintering at a normal pressure.

Therefore, the invention can provide a piezoelectric ceramic composition that does not contain lead, can be sintered at a normal pressure and has a high mechanical quality coefficient and a small dielectric loss. Incidentally, the piezoelectric ceramic compositions of this invention and the later-appearing second and third aspects of the invention include a dielectric ceramic composition having dielectric characteristics.

A second aspect of the invention provides a method of producing a piezoelectric ceramic composition comprising the steps of mixing a piezoelectric ceramic composition expressed by the general formula $\{Li_x(K_{1-y}Na_y)_{1-x}\}(Nb_{1-z}Ta_z)O_3$, each of x, y and z respectively falling within composition range of $0 \leq x \leq 0.2$, $0 \leq y \leq 1.0$ and $0 \leq z \leq 0.4$, and nickel or a nickel-containing compound; and sintering the resulting mixture.

In the production method of this invention, a piezoelectric ceramic composition expressed by the general formula $\{Li_x(K_{1-y}Na_y)_{1-x}\}(Nb_{1-z}Ta_z)O_3$, each of x, y and z respectively falling within composition range of $0 \leq x \leq 0.2$, $0 \leq y \leq 1.0$ and $0 \leq z \leq 0.4$, and nickel or a nickel-containing compound are mixed and sintered as described above.

Consequently, nickel or the nickel-containing compound can be easily contained in the piezoelectric ceramic composition expressed by the general formula $\{Li_x(K_{1-y}Na_y)_{1-x}\}(Nb_{1-z}Ta_z)O_3$ during mixing and sintering.

The piezoelectric ceramic composition described above can be sintered at a normal pressure during sintering. Therefore, the piezoelectric composition described above, that is, the composition that does not contain lead, has a high mechanical quality coefficient Qm and a small dielectric loss and can be easily obtained.

A third aspect of the invention provides a method of producing a piezoelectric ceramic composition comprising the steps of mixing a lithium-containing compound, a sodium-containing compound, a potassium-containing compound, a niobium-containing compound, a tantalum-containing compound and a nickel-containing compound; and sintering the mixture.

In this invention, a lithium-containing compound, a sodium-containing compound, a potassium-containing compound, a niobium-containing compound, a tantalum-containing compound and a nickel-containing compound are mixed and sintered as described above.

Consequently, nickel or the nickel-containing compound can be easily contained in the piezoelectric ceramic composition expressed by the general formula $\{Li_x(K_{1-y}Na_y)_{1-x}\}(Nb_{1-z}Ta_z)O_3$ during mixing and sintering.

The piezoelectric ceramic composition described above can be sintered at a normal pressure during sintering. Therefore, the piezoelectric composition obtained after mixing and sintering does not contain lead has a high mechanical quality coefficient Qm and a small dielectric loss and can be easily obtained.

A fourth aspect of the invention provides a piezoelectric device having a piezoelectric body formed of the piezoelectric ceramic composition of the first invention.

The piezoelectric device of the invention uses a piezoelectric body formed of the piezoelectric ceramic composition containing a compound expressed by the general formula $\{Li_x(K_{1-y}Na_y)_{1-x}\}(Nb_{1-z}Ta_z)O_3$, each of x, y and z respectively falling within composition range of $0 \leq x \leq 0.2$, $0 \leq y \leq 1.0$ and $0 \leq z \leq 0.4$, as its main component, and the piezoelectric ceramic composition further contains nickel or nickel-containing compound.

Therefore, the piezoelectric device can utilize as such the excellent characteristics of the piezoelectric ceramic composition in that it does not contain lead and has a high mechanical quality coefficient Qm and a small dielectric loss.

A fifth aspect of the invention provides a piezoelectric device having a piezoelectric body formed of a piezoelectric ceramic composition that is produced by the method of producing a piezoelectric ceramic composition according to the second or third aspect of the invention.

The piezoelectric device of this invention uses the piezoelectric ceramic composition obtained by the production method described above as a piezoelectric body. Therefore, the piezoelectric device can utilize as such the excellent characteristics of the piezoelectric ceramic composition.

(Re: Problem 2)

The following sixth to tenth aspects of the invention are means for solving the Problem 2 described above.

The sixth invention provides a piezoelectric ceramic composition expressed by the general formula $\{Li_x(K_{1-y}Na_y)_{1-x}\}\{Nb_{1-z-n}Ta_z(Mn_{0.5}W_{0.5})_n\}O_3$, each of x, y, z and n respectively falling within composition range of $0 \leq x \leq 0.2$, $0 \leq y \leq 1.0$, $0 \leq z \leq 0.4$ and $0 < n \leq 0.1$.

Next, the function and effect of this invention will be explained.

The piezoelectric ceramic composition of this invention is expressed by the general formula $\{Li_x(K_{1-y}Na_y)_{1-x}\}\{Nb_{1-z-n}Ta_z(Mn_{0.5}W_{0.5})_n\}O_3$, and does not contain lead in the composition.

Therefore, detrimental lead does not elute from wastes of the piezoelectric ceramic composition to the natural world, and the piezoelectric ceramic composition is safe.

Because x, y, z and n fall within the respective ranges in the general formula given above, the piezoelectric ceramic composition has a high piezoelectric $d_{31}$ constant and a high electro-mechanical coupling coefficient Kp as will be obvious from the later-appearing Examples. The piezoelectric ceramic composition can be sufficiently compacted by sintering at a normal pressure.

Therefore, the invention can provide a piezoelectric ceramic composition that does not contain lead, can be sintered at a normal pressure and has a high piezoelectric $d_{31}$ constant and a high electro-mechanical coupling coefficient Kp. Incidentally, the piezoelectric ceramic composition in the invention includes not only ceramic compositions having piezoelectric characteristics but also dielectric ceramic compositions having dielectric characteristics.

Next, a seventh invention provides a method of producing a piezoelectric ceramic composition comprising the steps of molding powder formed of a piezoelectric ceramic composition expressed by the general formula $\{Li_x(K_{1-y}Na_y)_{1-x}\}(Nb_{1-z-n}Ta_{z(Mn0.5}W_{0.5})_n O_3$ each of x, y, z and n respectively falling within composition range of $0 \leq x \leq 0.2$, $0 \leq y \leq 1.0$, $0 \leq z \leq 0.4$ and $0 \leq n \leq 0.1$; and sintering the molding.

The molding obtained by molding powder formed of the piezoelectric ceramic composition described above can be sintered at a normal pressure. Therefore, sintering can be conducted easily and at a low cost. The piezoelectric ceramic composition obtained after sintering does not contain lead but has a high piezoelectric $d_{31}$ constant and a high electro-mechanical coupling coefficient Kp. Therefore, this molding can be utilized as a material for high-performance piezoelectric devices or dielectric devices.

An eighth invention provides a method of producing a piezoelectric ceramic composition comprising the steps of mixing a lithium-containing compound, a sodium-containing compound, a potassium-containing compound, a niobium-containing compound, a tantalum-containing compound, a manganese-containing compound and a tungsten-containing compound; and sintering the mixture.

In this invention, a lithium-containing compound, a sodium-containing compound, a potassium-containing compound, a niobium-containing compound, a tantalum-containing compound, a manganese-containing compound and a tungsten-containing compound are mixed and sintered as described above.

Consequently, a piezoelectric ceramic composition expressed by the general formula $\{Li_x(K_{1-y}Na_y)_{1-x}\}\{Nb_{1-z-n}Ta_z(Mn_{0.5}W_{0.5})_n\}O_3$, each of x, y, z and n respectively falling within composition range of $0 \leq x \leq 0.2$, $0 \leq y \leq 1.0$, $0 \leq z \leq 0.4$ and $0 < n \leq 0.1$, can be easily obtained.

The piezoelectric ceramic composition described above can be sintered at a normal pressure during sintering. The piezoelectric ceramic composition obtained after sintering does not contain lead but has a high piezoelectric $d_{31}$ constant and a high electro-mechanical coupling coefficient Kp.

A ninth invention provides a piezoelectric device having a piezoelectric body formed of the piezoelectric body formed of the piezoelectric ceramic composition of the first aspect of invention.

The piezoelectric device of this invention uses the piezoelectric body formed of the piezoelectric ceramic composition expressed by the general formula $\{Li_x(K_{1-y}Na_y)_{1-x}\}\{Nb_{1-z-n}Ta_z(Mn_{0.5}W_{0.5})_n\}O_3$, each of x, y, z and n respectively falling within composition range of $0 \leq x \leq 0.2$, $0 \leq y \leq 1.0$, $0 \leq z \leq 0.4$ and $0 < n \leq 0.1$.

Therefore, the piezoelectric device can utilize as such the excellent characteristics of the piezoelectric ceramic composition that it does not contain lead, and has a high piezoelectric $d_{31}$ constant and a high electro-mechanical coupling coefficient Kp.

A tenth invention provides a piezoelectric device having a piezoelectric body formed of the piezoelectric ceramic composition produced by the production method of a piezoelectric ceramic composition of the seventh or eighth aspect of the invention.

The piezoelectric device of this invention uses the piezoelectric ceramic composition obtained by the production method of the seventh or eighth aspect of the invention as the piezoelectric body. Therefore, the piezoelectric device can utilize as such the excellent characteristics of the piezoelectric ceramic composition.

DESCRIPTION OF THE PREFERRED EMBODIMENTS (Re: 1$^{st}$ to 5$^{th}$ Invention for Solving Problem 1)

In the present invention, the piezoelectric ceramic composition described above is expressed by the general formula $\{Li_x(K_{1-y}Na_y)_{1-x}\}(Nb_{1-z}Ta_z)O_3$, and each of x, y and z is within the composition range of $0 \leq x \leq 0.2$, $0 \leq y \leq 1.0$ and $0 \leq z \leq 0.4$.

Here, when x>0.2 and z>0.2, the mechanical quality coefficient Qm of the piezoelectric ceramic composition drops or its dielectric loss becomes great, and the piezoelectric ceramic composition having desired piezoelectric characteristics cannot be obtained.

In the first aspect of the invention, the content of nickel or the nickel-containing compound is preferably 10 mol % or below, calculated as the nickel element, per mol of the main component described above.

When the content of nickel or the nickel-containing compound exceeds 10 mol % calculated as the nickel element, the piezoelectric $d_{31}$ constant of the piezoelectric ceramic composition drops, and it will be difficult to utilize the piezoelectric ceramic composition as the piezoelectric device. When the content is less than 0.01 mol %, the mechanical quality coefficient Qm will not be improved in comparison with the piezoelectric ceramic composition of the prior art. Therefore, the content of nickel or the nickel-containing compound is preferably 0.01 mol % or above.

Next, the piezoelectric ceramic composition preferably contains nickel that replaces at least one of Li, K, Na, Nb and Ta in the general formula described above.

In this case, too, the piezoelectric ceramic composition can exhibit excellent characteristics in that the mechanical quality coefficient is high and the dielectric loss is small, because it contains nickel.

The piezoelectric ceramic composition preferably has a mechanical quality coefficient Qm of at least 200.

In this case, the piezoelectric ceramic composition can be utilized as piezoelectric devices having less exothermy and a high conversion efficiency of electric energy to mechanical energy such as piezoelectric actuators, piezoelectric ultrasonic motors, piezoelectric transformers, piezoelectric vibrators, etc, by making the most of its high mechanical quality coefficient Qm of 200 or above.

Next, the piezoelectric ceramic composition preferably has a Curie point of 200° C. or above.

In this case, the piezoelectric ceramic composition can be utilized in a high-temperature environment such as in the proximity of automobile engines by making the most of its high Curie point of 200° C. or above.

Next, the piezoelectric ceramic composition preferably has a piezoelectric $d_{31}$ constant of 30 pm/V or above.

In this case, the piezoelectric ceramic composition can be utilized as high-sensitivity sensors, etc, by making the most of its high piezoelectric $d_{31}$ constant of 30 pm/V or above.

Next, the piezoelectric ceramic composition preferably has an electro-mechanical coupling coefficient Kp of 0.25 or above.

In this case, the piezoelectric ceramic composition can be utilized as piezoelectric actuators, piezoelectric vibrators, etc, having excellent conversion efficiency of mechanical energy and electric energy by making the most of its high electro-mechanical coupling coefficient Kp of at least 0.25.

Next, the piezoelectric ceramic composition preferably has a dielectric loss of 0.035 or below.

In this case, the piezoelectric ceramic composition can be utilized as sensors, etc, having a small dielectric loss noise resulting from the dielectric loss by making the most of its low dielectric loss of 0.035 or below.

It is preferred in the third aspect of the invention that the lithium-containing compound is $Li_2CO_3$, the sodium-containing compound is $Na_2CO_3$, the potassium-containing compound is $K_2CO_3$, the niobium-containing compound is $Nb_2O_5$, the tantalum-containing compound is $Ta_2O_5$ and the nickel-containing compound is NiO.

In this case, the piezoelectric ceramic composition described above can be easily produced.

In the fourth or fifth aspect of the invention, examples of the piezoelectric devices include piezoelectric vibrators, surface wave filters, piezoelectric sensors, actuators, ultrasonic motors, piezoelectric transformers, piezoelectric gyro sensors, knock sensors, and so forth.

(Re: Sixth to Tenth Aspects of the Invention for Solving Problem 2)

The piezoelectric ceramic composition is expressed by the general formula $\{Li_x(K_{1-y}Na_y)_{1-x}\}\{Nb_{1-z-n}Ta_z(Mn_{0.5}W_{0.5})_n\}O_3$, and each of x, y, z and n is within the composition range of $0 \leq x \leq 0.2$, $0 \leq y \leq 1.0$, $0 \leq z \leq 0.4$ and $0 < n \leq 0.1$.

Here, when x>0.2, z>0.4 and n>01 or n=0, the piezoelectric $d_{31}$ constant of the piezoelectric ceramic composition and its electro-mechanical coupling coefficient Kp drop, and a piezoelectric ceramic composition having the desired characteristics cannot be obtained.

In the sixth aspect of the invention, the piezoelectric ceramic composition described above preferably has a piezoelectric $d_{31}$ constant of 30 pm/V or above.

In this case, the piezoelectric ceramic composition described above can be utilized as sensors and actuators each having a high sensitivity by making the most of the high piezoelectric $d_{31}$ constant of 30 pm/V or above.

Next, the piezoelectric ceramic composition preferably has an electro-mechanical coupling coefficient Kp of 0.25 or above.

In this case, the piezoelectric ceramic composition described above can be utilized as piezoelectric actuators, piezoelectric vibrators, etc, having excellent conversion efficiency of mechanical energy and electric energy by making the most of its high electro-mechanical coupling coefficient Kp of 0.25 or above.

Next, the piezoelectric ceramic composition preferably has a dielectric loss of 0.05 or below.

In this case, the piezoelectric ceramic composition can be utilized as sensors, etc, having a small dielectric loss noise resulting from the dielectric loss by making the most of its low dielectric loss of 0.05 or below.

Next, the piezoelectric ceramic composition preferably has a Curie point of 200° C. or above.

In this case, the piezoelectric ceramic composition can be utilized in a high-temperature environment such as in the proximity of automobile engines by making the most of its high Curie point of 200° C. or above.

In the eighth aspect of the invention, it is preferred that the lithium-containing compound is $Li_2CO_3$, the sodium-containing compound is $Na_2CO_3$, the potassium-containing compound is $K_2CO_3$, the niobium-containing compound is $Nb_2O_5$, the tantalum-containing compound is $Ta_2O_5$, the manganese-containing compound is MnO, $MnO_2$ or $MnCO_3$ and the tungsten-containing compound is $WO_3$ or $MnWO_4$.

In this case, the piezoelectric ceramic composition described above can be easily produced.

In the ninth or tenth aspect of the invention, examples of the piezoelectric devices include piezoelectric vibrators, surface wave filters, piezoelectric sensors, actuators, ultrasonic motors, piezoelectric transformers, piezoelectric gyro sensors, knock sensors, and so forth.

The following Examples 1, 2 and Example 3 respectively relate to the inventions for solving the Problem 1 and the Problem 2.

EXAMPLE 1

Piezoelectric ceramic compositions according to the Example will be explained.

In the example, the piezoelectric ceramic composition described above is produced, and its piezoelectric characteristics are measured.

The piezoelectric ceramic composition of this example is a piezoelectric ceramic composition containing a compound expressed by the general formula $\{Li_x(K_{1-y}Na_y)_{1-x}\}(Nb_{1-z}Ta_z)O_3$, each of x, y and z falling within the composition range of $0 \leq x \leq 0.2$, $0 \leq y \leq 1.0$ and $0 \leq z \leq 0.4$, as its main component. The piezoelectric ceramic composition contains nickel or a nickel-containing compound.

Hereinafter, a method of producing the piezoelectric ceramic composition of this example will be explained.

First, a lithium-containing compound, a sodium-containing compound, a potassium-containing compound, a niobium-containing compound, a tantalum-containing compound and a nickel-containing compound are mixed and sintered.

More concretely, $Li_2CO_3$ as the lithium-containing compound, $Na_2CO_3$ as the sodium-containing compound, $K_2CO_3$ as the potassium-containing compound, $Nb_2O_5$ as the niobium-containing compound, $Ta_2O_5$ as the tantalum-containing compound and NiO as the nickel-containing compound are prepared as the starting materials of the piezoelectric ceramic composition. These starting materials have purity of 99% or above.

Next, these starting materials are blended in such a fashion as to satisfy x=0.1, y=0.5 and z=0.1 in the general formula $\{Li_x(K_{1-y}Na_y)_{1-x}\}(Nb_{1-z}Ta_z)O_3$. Further, 1 mol % of NiO calculated as the nickel element is blended. The starting materials after blending are mixed in acetone for 24 hours in a ball mill to give a mixture of the starting materials.

Next, the mixture is calcined at 750° C. for 5 hours, and the mixture after calcination is pulverized for 24 hours in the ball mill. Subsequently, polyvinyl butyral as a binder is added and the mixture is granulated.

The powder after granulation is press-molded at a pressure of 2 tons/cm² into a disc having a diameter of 13 mm and a thickness of 2 mm, and the resulting molding is sintered at 1,000 to 1,300° C. for one hour at normal pressure. Here, the molding after sintering is compacted to a relative density of at least 98%.

Both surfaces of each molding after sintering are parallel polished and disc polished. Gold electrodes are then provided to both surfaces of the disc sample by sputtering. A DC voltage of 1 to 5 kV/mm is applied across the electrodes, inside silicone oil, at 100° C. for 10 minutes, and polarization is attained in the direction of thickness to give the piezoelectric ceramic composition of this example (product of invention).

The mechanical quality coefficient Qm, the Curie point, the piezoelectric $d_{31}$ constant, the electro-mechanical coupling coefficient Kp, the dielectric loss, the relative dielectric constant and a frequency constant Np in the radial direction are measured for the piezoelectric ceramic composition so produced in this example. Here, the mechanical quality coefficient Qm, the piezoelectric $d_{31}$ constant, the electro-mechanical coupling coefficient Kp and the frequency constant Np are measured in accordance with a resonance-antiresonance method by use of an impedance analyzer. The dielectric loss and the relative dielectric constant are measured at a measurement frequency of 1 kHz by use of the impedance analyzer. The Curie point is measured by raising the temperature of the piezoelectric ceramic composition by 2° C. per minute to 600° C. to measure the relative dielectric constant, and the temperature giving the highest relative dielectric constant is selected as the Curie point.

The results are shown in Table 1.

TABLE 1

|  | product of invention | comparative product |
| --- | --- | --- |
| mechanical quality coefficient Qm | 457 | 108 |
| Curie point (° C.) | 426 | 450 |
| piezoelectric $d_{31}$ constant (pm/V) | 39.9 | 39.6 |
| electro-mechanical coupling coefficient Kp | 0.299 | 0.292 |
| dielectric loss | 0.0123 | 0.0388 |
| relative dielectric loss | 725 | 672 |
| frequency constant Np (Hz · m) | 2691 | 2579 |

To clarify the excellent characteristics of the piezoelectric ceramic composition of the invention, this example produces the comparative products in the following way.

First, high purity $Li_2CO_3$, $Na_2CO_3$, $K_2CO_3$, $Nb_2O_5$ and $Ta_2O_5$ each having a purity of at least 99% are prepared as the starting materials of the comparative product. The starting materials are blended in such a fashion as to satisfy x=0.1, y=0.5 and z=0.1 in the general formula $\{Li_x(K_{1-y}Na_y)_{1-x}\}(Nb_{1-z}Ta_z)O_3$. The starting materials after blending are mixed in acetone for 24 hours by use of a ball mill to prepare a mixture of the starting materials.

Next, this mixture is calcined at 750° C. for 5 hours, and the mixture after calcination is pulverized for 24 hours in the ball mill and is then granulated in the same way as in the product of the invention.

The powder after granulation is press-molded at a pressure of 2 tons/cm² into a disc having a diameter of 13 mm and a thickness of 2 mm, and the resulting molding is sintered at 1,000 to 1,300° C. for one hour. The molding after sintering is compacted to a relative density of 98% or above.

Both surfaces of the molding after sintering are straight-polished and disc-polished. Gold electrodes are then provided to both surfaces of the disc sample by sputtering. A DC voltage of 1 to 5 kV/mm is applied across the electrodes for 10 minutes, in silicone oil, at 100° C. for 10 minutes, and polarization is attained in the direction of thickness to give the comparative product.

The mechanical quality coefficient Qm, the Curie point, the piezoelectric $d_{31}$ constant, the electro-mechanical coupling coefficient Kp, the dielectric loss, the relative dielectric constant and the frequency constant Np in the radial direction are measured for the comparative product so produced. The measurement method of each measurement value is the same as that of the products of the invention.

The result is tabulated in Table 1.

It can be seen from Table 1 that the mechanical quality coefficient Qm of the product of the invention is higher by at least 4 times than that of the comparative product. Therefore, the piezoelectric ceramic composition of the invention can be used for piezoelectric actuators, ultrasonic motors, piezoelectric transformers, piezoelectric vibrator components, etc, each having less exothermy. When the piezoelectric ceramic composition is used for these piezoelectric devices, the mechanical quality coefficient Qm is preferably 200 or above.

Besides the mechanical quality coefficient Qm described above, the product of the invention exhibits a higher piezoelectric $d_{31}$ constant than that of the comparative products.

When a charge detection type circuit or a current detection type circuit is used, the piezoelectric $d_{31}$ constant is generally proportional to an output voltage of a piezoelectric type sensor such as acceleration sensors, pressure application sensors, impact sensors and knock sensors. From this aspect, a piezoelectric ceramic composition having a higher piezoelectric $d_{31}$ constant can fabricate a sensor having a greater charge sensor output. To produce sensors having characteristics at least equivalent to those of the comparative product, the composition preferably has a piezoelectric $d_{31}$ constant of at least 30 pm/V and a mechanical quality coefficient Qm of at least 200.

The product of the invention exhibits a higher value in the electro-mechanical coupling coefficient Kp than that of the comparative products.

The electro-mechanical coupling coefficient Kp is generally proportional to electro-mechanical energy conversion efficiency of piezoelectric transformers, ultrasonic motors or ultrasonic vibrators. From this aspect, a piezoelectric ceramic composition having a higher electro-mechanical coupling coefficient Kp can fabricate piezoelectric transformers, ultrasonic motors or ultrasonic vibrators having higher electro-mechanical energy conversion efficiency. To produce piezoelectric transformers, ultrasonic motors or ultrasonic vibrators having characteristics at least equivalent to those of the comparative product, the composition preferably has an electro-mechanical coupling coefficient Kp of at least 0.25 and a mechanical quality coefficient Qm of at least 200.

The dielectric loss of the products of the invention exhibits a value not greater than ⅓ of that of the comparative product. Therefore, the piezoelectric ceramic composition of the invention can be utilized for sensors having a small dielectric loss noise resulting from the dielectric loss. When the piezoelectric ceramic composition is used for such a sensor piezoelectric device having a small dielectric loss noise, the dielectric loss is preferably 0.035 or below.

The Curie point of the piezoelectric ceramic composition of this example exhibits a high value of 426° C. Therefore, the piezoelectric ceramic composition of the example can be used for high-temperature sensor components, high-temperature sensor components such as knock sensors, etc, that can be stably used for a long time at high-temperature portions in the proximity of automobile engines. To stably use the composition as the high-temperature sensor components, etc, for a longer time, the Curie point described above is preferably higher than 200° C.

The relative dielectric constant of the product of the invention is higher than that of the comparative product and exhibits a high value of 725. Therefore, the piezoelectric ceramic composition of the product of the invention can be utilized not only for piezoelectric bodies but also for dielectric bodies. The relative dielectric constant is generally proportional to an electrostatic capacity of capacitors such as a laminated capacitor component. Therefore, the piezoelectric ceramic composition having a higher relative dielectric constant can fabricate a capacitor having a greater electrostatic capacity. As the piezoelectric ceramic composition of the present product has a high relative dielectric constant as described above, it can be utilized for capacitors having a large electrostatic capacity.

Next, the frequency constant Np of the present product exhibits a higher value than that of the comparative product. When the piezoelectric ceramic composition of the present products is used, therefore, compact piezoelectric vibrator components having a high frequency can be produced.

Incidentally, piezoelectric ceramic compositions are also produced from those compositions different from the composition range of the present product in the general formula $\{Li_x(K_{1-y}Na_y)_{1-x}\}(Nb_{1-z}Ta_z)O_3$, ($0 \leq x \leq 0.2$, $0 \leq y \leq 1.0$ and $0 \leq z \leq 0.4$), and their piezoelectric characteristics are measured. As a result, it is confirmed that similar effects can be obtained in the same way as in this example.

EXAMPLE 2

This example represents an example where the piezoelectric ceramic compositions are produced while the nickel amount is changed.

More concretely, $Li_2CO_3$ as the lithium-containing compound, $Na_2CO_3$ as the sodium-containing compound, $K_2CO_3$ as the potassium-containing compound, $Nb_2O_5$ as the niobium-containing compound, $Ta_2O_5$ as the tantalum-containing compound and NiO as the nickel-containing compound are prepared as the starting materials of the piezoelectric ceramic composition in the same way as in Example 1. These starting materials have purity of 99% or above.

Next, these starting materials are blended in such a fashion as to satisfy x=0.1, y=0.5 and z=0.1 in the general formula $\{Li_x(K_{1-y}Na_y)_{1-x}\}(Nb_{1-z}Ta_z)O_3$, that is, $Li_{0.1}(K_{0.45}Na_{0.45})(Nb_{0.9}Ta_{0.1})O_3$. Further, NiO is blended in such amounts as to attain 0.1 mol %, 0.5 mol %, 2 mol % and 5 mol % calculated as the nickel element to give four kinds of blend compositions. These starting materials are mixed in acetone for 24 hours in a ball mill to give mixtures of the starting materials.

Next, each mixture is calcined, pulverized and granulated after the addition of polyvinyl butyral as a binder in the same way as in Example 1.

The powder after granulation is press-molded and sintered in the same way as in Example 1. The resulting molding after sintering is compacted to a relative density of at least 98%.

Both surfaces of each molding after sintering are straight-polished and disc-polished. Gold electrodes are then provided to both surfaces of each disc sample by sputtering. A DC voltage of 1 to 5 kV/mm is applied across the electrodes, in silicone oil, at 100° C. for 10 minutes, and polarization is attained in the direction of thickness to give four kinds of piezoelectric ceramic compositions. These piezoelectric ceramic compositions are respectively called Sample E1, Sample E2, Sample E4 and Sample E5.

All of the Samples E1, E2, E4 and E5 contain $Li_{0.1}(K_{0.45}Na_{0.45})(Nb_{0.9}Ta_{0.1})O_3$ as the main component but are different from one another only in the Ni content.

Here, Sample E1 contains 0.1 mol % of Ni per mol of $Li_{0.1}(K_{0.45}Na_{0.45})(Nb_{0.9}Ta_{0.1})O_3$. Similarly, Samples E2, E4 and E5 respectively contain 0.5 mol %, 2 mol % and 5 mol % of Ni per mol of $Li_{0.1}(K_{0.45}Na_{0.45})(Nb_{0.9}Ta_{0.1})O_3$.

The mechanical quality coefficient Qm, the piezoelectric $d_{31}$ constant, the electro-mechanical coupling coefficient Kp, the dielectric loss, the relative dielectric constant and the frequency constant Np in the radial direction are measured for these Samples E1, E2, E4 and E5. The measurement method is the same as that of Example 1.

The result is shown in Table 2. For comparison, the product of the invention and the comparative product in Example 1 are also shown as Sample E3 and Sample C, and the result of measurement of their piezoelectric and dielectric characteristics are shown, too. Incidentally, Sample E3 contains 1 mol % of Ni per mol of $Li_{0.1}(K_{0.45}Na_{0.45})(Nb_{0.9}Ta_{0.1})O_3$ and Sample C does not contain Ni.

Generally, the piezoelectric $d_{31}$ constant is proportional to an output voltage of a piezoelectric type sensors such as acceleration sensors, weight application sensors, impact sensors and knock sensors when a charge or current detection type detection circuit is used. Therefore, Samples E1 to E5 can be utilized for sensors having a high sensitivity and a large sensor output voltage by making the most of their piezoelectric $d_{31}$ constant.

Samples E1 to E5 all exhibit a high value of the relative dielectric constant equal to, or higher than, the value 672 of Sample C. The relative dielectric constant reaches maximum particularly when the Ni content is 5 mol % (Sample E5), and the relative dielectric constant 822 is as great as 822.

Therefore, the piezoelectric ceramic composition of the invention can be utilized not only as piezoelectric bodies but also as excellent dielectric bodies.

The relative dielectric constant is generally proportional to an electrostatic capacity of capacitors such as a laminated capacitor. From this aspect, a piezoelectric ceramic composition having a higher relative dielectric constant can fabricate a capacitor having a greater electrostatic capacity.

Samples E1 to E5 can be utilized for capacitors, etc, having a large electrostatic capacity by making the most of their excellent relative dielectric constant.

The dielectric losses of all the Samples E1 to E5 are smaller than that of Sample C, i.e. 0.0388. The dielectric loss

TABLE 2

| | Sample No. | | | | | |
|---|---|---|---|---|---|---|
| | Sample C | Sample E1 | Sample E2 | Sample E3 | Sample E4 | Sample E5 |
| Ni content (mol %) | 0 | 0.1 | 0.5 | 1 | 2 | 5 |
| mechanical quality coefficient Qm | 108 | 310 | 248 | 457 | 252 | 202 |
| piezoelectric $d_{31}$ constant (pm/V) | 39.6 | 41.2 | 41.9 | 39.9 | 50.5 | 47.2 |
| electro-mechanical coupling coefficient Kp | 0.292 | 0.328 | 0.316 | 0.299 | 0.356 | 0.326 |
| relative dielectric constant | 672 | 672 | 721 | 725 | 796 | 822 |
| dielectric loss | 0.0388 | 0.0168 | 0.0229 | 0.0123 | 0.0143 | 0.0193 |
| frequency constant Np (Hz · m) | 2579 | 2747 | 2698 | 2691 | 2637 | 2630 |

It can be understood from Table 2 that the mechanical coefficient coefficients Qm of all the Samples E1 to E5 are greater than the value 108 of Sample C. The mechanical coefficient coefficients Qm reach maximum particularly when the Ni content is 1 mol % (Sample E3), and this value is as great as four times the value of Sample C1 of 457.

The piezoelectric ceramic composition of each of the Samples E1 to E5 can be utilized for excellent piezoelectric actuators, piezoelectric ultrasonic motors, piezoelectric transformers and piezoelectric vibrator components each having less exothermy, by making the most of such a high mechanical quality coefficient Qm.

The piezoelectric $d_{31}$ constants of all the Samples E1 to E5 are greater than the value of Sample C, i.e. 39.6 pm/V, and their electro-mechanical coupling coefficients Kp are also greater than the value 0.292 of Sample C. The piezoelectric $d_{31}$ constant and the electro-mechanical coupling coefficient Kp reach maximum particularly when the Ni content is 2 mol % (Sample E4), and the values are 50.5 pm/V and 0.356.

reaches minimum particularly when the Ni content is 1 mol % (Sample E3), and the dielectric loss at this time is 0.0123 and is less than ⅓ of the dielectric loss of Sample C1.

The piezoelectric ceramic compositions of Samples E1 to E5 can be utilized for sensors having a small dielectric loss noise resulting from the dielectric loss.

Frequency constants Np of all the Samples E1 to E5 are greater than 2,579 of Sample C. The frequency constant Np reaches maximum particularly when the Ni content is 0.1 mol % (Sample E1), and reaches an extremely large value of 2,747 at this time.

The piezoelectric ceramic compositions of Samples E1 to E5 can fabricate smaller piezoelectric vibrator components when a vibrator having the same frequency as that of Sample C is produced, for example.

It has been confirmed that when the Ni content is increased beyond 10 mol %, the piezoelectric $d_{31}$ constant of the piezoelectric ceramic composition drops. Therefore, the application to the piezoelectric devices may become difficult.

Incidentally, piezoelectric ceramic compositions are also produced from those compositions different from the composition range of Samples E1 to E5 in the general formula $\{Li_x(K_{1-y}Na_y)_{1-x}\}(Nb_{1-z}Ta_z)O_3$ ($0 \leq x \leq 0.2$, $0 \leq y \leq 1.0$ and $0 \leq z \leq 0.4$), and their piezoelectric characteristics are measured. As a result, it is confirmed that similar effects can be obtained in the same way as in this example.

EXAMPLE 3

A piezoelectric ceramic composition of this example will be explained.

In this example, the piezoelectric ceramic composition is produced and its piezoelectric characteristics are measured.

The piezoelectric ceramic composition of this example is expressed by the general formula $\{Li_x(K_{1-y}Na_y)_{1-x}\}\{Nb_{1-z-n}Ta_z(Mn_{0.5}W_{0.5})_n\}O_3$, and x, y, z and n respectively fall within the composition range of $0 \leq x \leq 0.2$, $0 \leq y \leq 1.0$, $0 \leq z \leq 0.4$ and $0 < n \leq 0.1$.

First, high purity $Li_2CO_3$, $K_2CO_3$, $Na_2CO_3$, $Nb_2O_5$, $Ta_2O_5$, $MnO_2$ and $WO_3$ each having a purity of at least 99% are prepared as the starting materials. The starting materials are blended in such a fashion as to satisfy $x=0.1$, $y=0.5$, $z=0.1$ and $n=0.02$, respectively, in the general formula $\{Li_x(K_{1-y}Na_y)_{1-x}\}\{Nb_{1-z-n}Ta_z(Mn_{0.5}W_{0.5})_n\}O_3$. The starting materials after blending are mixed in acetone for 24 hours by use of a ball mill to prepare a starting material mixture.

Next, the mixture is calcined at 750° C. and the mixture after calcination is pulverized for 24 hours in the ball mill. After polyvinyl butyral is added as a binder, the mixture is granulated.

The powder after granulation is press-molded at a pressure of 2 tons/cm² into a disc having a diameter of 13 mm and a thickness of 2 mm, and the resulting molding is sintered at 1,000 to 1,300° C. for one hour at a normal pressure. The molding after sintering is compacted to a relative density 98% or more.

Both surfaces of the molding after sintering are straight-polished and disc-polished. Gold electrodes are then provided to both surface of the disc sample by sputtering. A DC voltage of 1 to 5 kV/mm is applied across the electrodes for 10 minutes, in silicone oil, at 100° C., and polarization is attained in the direction of thickness to give the piezoelectric ceramic composition (product of this invention).

The piezoelectric $d_{31}$ constant, the electro-mechanical coupling coefficient Kp, the dielectric loss, the Curie point, the relative dielectric constant, the frequency constant Np in the radial direction and the insulation resistance are measured for the piezoelectric ceramic composition of this example. Among them, the piezoelectric $d_{31}$ constant, the electro-mechanical coupling coefficient Kp and the frequency constant Np are measured in accordance with a resonance-antiresonance method using an impedance analyzer. The dielectric loss and the relative dielectric constant are measured by the same method as that of Example 1. The insulation resistance is measured in accordance with two-terminal method at an impressed voltage of 5 V/mm by use of a super-ohmmeter.

The result is tabulated in Table 3.

TABLE 3

| | product of invention | comparative product |
| --- | --- | --- |
| piezoelectric $d_{31}$ constant (pm/V) | 46.5 | 39.6 |
| electro-mechanical coupling coefficient Kp | 0.324 | 0.292 |
| dielectric loss | 0.0378 | 0.0388 |
| Curie point (° C.) | 415 | 450 |
| relative dielectric constant | 809 | 672 |
| frequency constant Np (Hz · m) | 2659 | 2579 |
| insulation resistance (Ω · cm) | $2.26 \times 10^{11}$ | $4.45 \times 10^9$ |

To clarify the excellent characteristics of the piezoelectric ceramic composition of the invention, this example produces the comparative product in the following way.

First, high purity $Li_2CO_3$, $K_2CO_3$, $Na_2CO_3$, $Nb_2O_5$ and $Ta_2O_5$ each having a purity of at least 99% are prepared as the starting materials of the comparative product. The starting materials are blended in such a fashion as to satisfy $x=0.1$, $y=0.5$, $z=0.1$ and $n=0$ in the general formula $\{Li_x(K_{1-y}Na_y)_{1-x}\}\{Nb_{1-z-n}Ta_z(Mn_{0.5}W_{0.5})_n\}O_3$. The starting materials after blending are mixed in acetone for 24 hours by use of a ball mill to prepare a mixture of the starting materials.

Next, this mixture is calcined at 750° C. for 5 hours, and the mixture after calcinations is pulverized for 24 hours in the ball mill and is then granulated in the same way as in the product of the invention.

Powder after granulation is press-molded at a pressure of 2 tons/cm² into a disc having a diameter of 13 mm and a thickness of 2 mm, and the resulting molding is sintered at 1,100 to 1,300° C. for one hour. The molding after sintering is compacted to a relative density of 98% or above.

Both surfaces of the molding after sintering are parallel polished and disc polished. Gold electrodes are then provided to both surfaces of each disc sample by sputtering. A DC voltage of 1 to 5 kV/mm is applied across the electrodes for 10 minutes, in silicone oil, at 100° C., and polarization is attained in the direction of thickness to give each comparative product.

The piezoelectric $d_{31}$ constant, the electro-mechanical coupling coefficient Kp, the dielectric loss, the Curie point, the relative dielectric constant and the frequency constant Np in the radial direction are measured for the comparative product so produced. The measurement method of each measurement value is the same as that of the products of the invention.

The result is shown in Table 3.

As can be seen from Table 3, the piezoelectric $d_{31}$ constant of the product of the invention exhibits a higher value than that of the comparative product.

Generally, the piezoelectric $d_{31}$ constant is proportional to an output voltage of piezoelectric type sensors such as acceleration sensors, weight application sensors, impact sensors and knock sensors when a charge or current detection type detection circuit is used. The piezoelectric $d_{31}$ constant is also proportional to a displacement amount of piezoelectric actuators. Therefore, a piezoelectric ceramic composition having a higher piezoelectric $d_{31}$ constant can produce sensors or piezoelectric actuators each having a greater charge sensor output. To produce sensors or piezoelectric actuators having characteristics at least equivalent to those of the comparative product, the product preferably has a piezoelectric $d_{31}$ constant of at least 30 pm/V.

The electro-mechanical coupling coefficient Kp of the present product exhibits a higher value than that of the comparative product.

The electro-mechanical coupling coefficient Kp is generally proportional to electro-mechanical energy conversion efficiency of piezoelectric transformers, ultrasonic motors, actuators or ultrasonic vibrators. From this aspect, a piezoelectric ceramic composition having a higher electro-mechanical coupling coefficient Kp can fabricate piezoelectric transformers, ultrasonic motors, actuators or ultrasonic vibrators having higher electro-mechanical energy conversion efficiency. To produce piezoelectric transformers, ultrasonic motors or ultrasonic vibrators having characteristics at least equivalent to those of the comparative products, the composition preferably has an electro-mechanical coupling coefficient Kp of at least 0.25.

The dielectric loss of the products of the invention exhibits a value not greater than 1/3 of that of the comparative products. Therefore, the piezoelectric ceramic composition of the invention can be utilized for sensors having a small dielectric loss noise resulting from the dielectric loss. When the piezoelectric ceramic composition is used for such a sensor piezoelectric device having a small dielectric loss noise, the dielectric loss is preferably 0.035 or below.

The Curie points of the piezoelectric ceramic composition of this example exhibits a high value of 415° C. Therefore, the piezoelectric ceramic composition of the example can be used for high-temperature sensor components, actuator components or ultrasonic motor components such as knock sensors that can be stably used for a long time at high-temperature portions in the proximity of automobile engines. To stably use the composition as the high-temperature sensor components, etc, for a longer time, the Curie point described above is preferably higher than 200° C.

The relative dielectric constant of the product of the invention is higher than that of the comparative product and exhibits a high value of 809. Therefore, the piezoelectric ceramic composition of the product of the invention can be utilized not only for piezoelectric bodies but also for dielectric bodies. The relative dielectric constant is generally proportional to an electrostatic capacity of capacitors such as a laminated capacitor component. Therefore, the piezoelectric ceramic composition having a higher relative dielectric constant can fabricate a capacitor having a greater electrostatic capacity. Since the piezoelectric ceramic composition of the present product has a high relative dielectric constant as described above, it can be utilized for capacitors having a large electrostatic capacity.

Next, the frequency constant Np of the present product exhibits a higher value than that of the comparative product. When the piezoelectric ceramic composition of the present product is used, therefore, compact piezoelectric vibrator components having a high frequency can be produced.

The insulation resistance of the product of the invention exhibits an extremely higher value than that of the comparative product. Therefore, the product of the invention is most suitable for piezoelectric actuators for use in a strong electric field.

Incidentally, piezoelectric ceramic compositions are also produced from those compositions different from the composition range of the present product in the general formula $\{Li_x(K_{1-y}Na_y)_{1-x}\}\{Nb_{1-z-n}Ta_z(Mn_{0.5}W_{0.5})_n\}O_3$ ($0 \leq x \leq 0.2$, $0 \rightarrow y \leq 1.0$, $0 \leq z \leq 0.4$, $0 < n \leq 0.1$), and their piezoelectric characteristics are measured. As a result, it is confirmed that similar effects can be obtained in the same way as in this example.

What is claimed is:

1. A piezoelectric ceramic composition containing a compound expressed by the general formula $\{Li_x(K_{1-y}Na_y)_{1-x}\}(Nb_{1-z}Ta_z)O_3$, each of x, y and z respectively falling within composition range of $0<x\leq0.2$, $0<y<1.0$ and $0\leq z\leq0.4$, as a main component, and further containing nickel replacing at least one kind of Li, K, Na, Nb and Ta.

2. A piezoelectric ceramic composition as defined in claim 1, wherein a content of said nickel calculated as a nickel element is 10 mol% or below per mol of said main component.

3. A piezoelectric ceramic composition as defined in claim 1, wherein a mechanical quality coefficient Qm of said piezoelectric ceramic composition is 200 or above.

4. A piezoelectric ceramic composition as defined in claim 1, wherein a Curie point of said piezoelectric ceramic composition is 200° C. or above.

5. A piezoelectric ceramic composition as defined in claim 1, wherein a piezoelectric $d_{31}$ constant of said piezoelectric ceramic composition is 30 pm/V or above.

6. A piezoelectric ceramic composition as defined in claim 1, wherein an electro-mechanical coupling coefficient Kp of said piezoelectric ceramic composition is 0.25 or above.

7. A piezoelectric ceramic composition as defined in claim 1, wherein a dielectric loss of said dielectric ceramic composition is 0.035 or below.

8. A method of producing a piezoelectric ceramic composition comprising the steps of:
mixing a piezoelectric ceramic composition expressed by the general formula $\{Li_x(K_{1-y}Na_y)_{1-x}\}(Nb_{1-z}Ta_z)O_3$, each of x, y and z respectively falling within composition range of $0<x\leq0.2$, $0<y<1.0$ and $0\leq z\leq0.4$, and nickel; and
sintering the resulting mixture.

9. A method of producing a piezoelectric ceramic composition for obtaining said piezoelectric ceramic composition as defined in claim 1, said method comprising the steps of:
mixing a lithium-containing compound, a sodium-containing compound, a potassium-containing compound, a niobium-containing compound, a nickel-containing compound and optionally a tantalum-containing compound; and
sintering the mixture.

10. A piezoelectric device having a piezoelectric body formed of said piezoelectric ceramic composition as defined in claim 1.

11. A piezoelectric ceramic composition expressed by the general formula $\{Li_x(K_{1-y}Na_y)_{1-x}\}\{Nb_{1-z-n}Ta_z(Mn_{0.5}W_{0.5})_n\}O_3$, each of x, y, z and n respectively falling within composition range of $0\leq x\leq0.2$, $0\leq y\leq1.0$, $0\leq z\leq0.4$ and $0<n\leq0.1$.

12. A piezoelectric ceramic composition as defined in claim 11, wherein a piezoelectric $d_{31}$ constant of said piezoelectric ceramic composition is 30 pm/V or above.

13. A piezoelectric ceramic composition as defined in claim 11, wherein an electro-mechanical coupling coefficient Kp of said piezoelectric ceramic composition is 0.25 or above.

14. A piezoelectric ceramic composition as defined in claim 11, wherein a dielectric loss of said dielectric ceramic composition is 0.05 or below.

15. A piezoelectric ceramic composition as defined in claim 11, wherein a Curie point of said piezoelectric ceramic composition is 200° C. or above.

16. A method of producing a piezoelectric ceramic composition comprising the steps of:
molding powder formed of a piezoelectric ceramic composition expressed by the general formula $\{Li_x(K_{1-y}Na_y)_{1-x}\}\{Nb_{1-z-n}Ta_z(Mn_{0.5}W_{0.5})_n\}O_3$, each of x, y, z and n respectively falling within composition range of $0 \leq x \leq 0.2$, $0 \leq y \leq 1.0$, $0 \leq z \leq 0.4$ and $0 < n \leq 0.1$; and sintering the molding.

17. A method of producing a piezoelectric ceramic composition for obtaining said piezoelectric ceramic composition as defined in claim 11, said method comprising the steps of:

mixing a niobium-containing compound, a manganese-containing compound, a tungsten-containing compound, optionally a lithium-containing compound, optionally a sodium-containing compound, optionally a potassium-containing compound, and optionally a tantalum-containing compound; and sintering the mixture.

18. A piezoelectric device having a piezoelectric body formed of said piezoelectric ceramic composition as defined in claim 11.

19. A method of producing a piezoelectric ceramic composition for obtaining a piezoelectric ceramic composition as defined in claim 1, said method comprising the steps of:

mixing $Li_2CO_3$, $Na_2CO_3$, $K_2CO_3$, $Nb_2O_5$, NiO and optionally $Ta_2O_5$;

and sintering the mixture.

20. A method of producing a piezoelectric ceramic composition for obtaining a piezoelectric ceramic composition as defined in claim 11, said method comprising the steps of:

mixing $Nb_2O_5$, a manganese-containing compound selected from the group consisting of Mn, $MnO_2$ and $MnCO_3$, $WO_3$, optionally $Li_2CO_3$, optionally $Na_2CO_3$, optionally $K_2CO_3$, and optionally $Ta_2O_5$;

and sintering the mixture.

* * * * *